US009459323B2

(12) United States Patent
Mukaitani et al.

(10) Patent No.: US 9,459,323 B2
(45) Date of Patent: *Oct. 4, 2016

(54) BATTERY-STATE MONITORING SYSTEM

(75) Inventors: Ichiro Mukaitani, Tokyo (JP); Takashi Kofuse, Tokyo (JP); Mitsuyoshi Kanoh, Tokyo (JP); Shinya Mizusugi, Tokyo (JP); Yasuhiro Shibata, Tokyo (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 104 days.

This patent is subject to a terminal disclaimer.

(21) Appl. No.: 14/356,798

(22) PCT Filed: Jun. 1, 2012

(86) PCT No.: PCT/JP2012/064319
§ 371 (c)(1),
(2), (4) Date: May 7, 2014

(87) PCT Pub. No.: WO2013/069328
PCT Pub. Date: May 16, 2013

(65) Prior Publication Data
US 2014/0312915 A1 Oct. 23, 2014

(30) Foreign Application Priority Data

Nov. 8, 2011 (JP) .................................. 2011-244569

(51) Int. Cl.
G01N 27/416 (2006.01)
H02J 7/00 (2006.01)
G01R 31/36 (2006.01)

(52) U.S. Cl.
CPC ....... *G01R 31/3606* (2013.01); *G01R 31/3624* (2013.01); *G01R 31/3662* (2013.01);
(Continued)

(58) Field of Classification Search
CPC .......... G01R 31/3606; G01R 31/3624; G01R 31/3662; G01R 31/3679; H02J 7/0021; H02J 7/007
USPC ........................................... 324/434; 320/136
See application file for complete search history.

(56) References Cited

U.S. PATENT DOCUMENTS 6,094,031 A 7/2000 Shimane et al.
8,829,717 B2 * 9/2014 Kudo .................... H02J 7/0018
307/77
(Continued)

FOREIGN PATENT DOCUMENTS

CN 201489093 U 5/2010
CN 102183730 A 9/2011
(Continued)

OTHER PUBLICATIONS

U.S. Appl. No. 14/356,778, filed May 7, 2014.
(Continued)

*Primary Examiner* — M'Baye Diao
(74) *Attorney, Agent, or Firm* — Crowell & Moring LLP

(57) ABSTRACT

A battery-state monitoring system capable of efficiently estimating the state and service life of each storage battery at high precision by automatically measuring or acquiring various parameters of a plurality of storage batteries constantly connected to an equipment is provided. The system monitors a state of each of a plurality of batteries connected in series and constituting an assembled battery incorporated in an equipment includes a power supply control device that detects a current flowing through each battery; and an end device that measures a temperature, a voltage, and internal resistance of each battery, the internal resistance being measured by using at least two or more kinds of frequencies, and degradation of each battery is estimated based on one or more temperature, voltage, and internal resistance.

11 Claims, 5 Drawing Sheets

(52) U.S. Cl.
CPC ........... *G01R31/3679* (2013.01); *H02J 7/007* (2013.01); *H02J 7/0021* (2013.01); *G01R 31/3658* (2013.01); *G01R 31/3689* (2013.01)

(56) References Cited

U.S. PATENT DOCUMENTS

| | | | |
|---|---|---|---|
| 2004/0076872 A1 | 4/2004 | Kinoshita et al. | |
| 2007/0132456 A1 | 6/2007 | Salman et al. | |
| 2007/0279953 A1 | 12/2007 | Hoff et al. | |
| 2008/0303528 A1 | 12/2008 | Kim | |
| 2009/0096459 A1* | 4/2009 | Yoneda | G01R 31/3651 324/430 |
| 2010/0001693 A1 | 1/2010 | Iida et al. | |
| 2011/0031048 A1 | 2/2011 | Ohkura | |
| 2011/0193413 A1* | 8/2011 | Kudo | H02J 7/0018 307/77 |
| 2014/0103934 A1 | 4/2014 | Matsui et al. | |
| 2014/0152261 A1* | 6/2014 | Yamauchi | B60L 11/1866 320/118 |
| 2014/0354291 A1* | 12/2014 | Kikuchi | H02J 7/00 324/434 |

FOREIGN PATENT DOCUMENTS

| | | |
|---|---|---|
| EP | 2 605 327 A1 | 6/2013 |
| GB | 2463145 A | 3/2010 |
| JP | 62-34082 A | 2/1987 |
| JP | 1-253177 A | 10/1989 |
| JP | 11-355904 A | 12/1999 |
| JP | 2000-58019 A | 2/2000 |
| JP | 2001-235525 A | 8/2001 |
| JP | 2005-26153 A | 1/2005 |
| JP | 2006-189436 A | 7/2006 |
| JP | 2007-85772 A | 4/2007 |
| JP | 2008-97941 A | 4/2008 |
| JP | 2009-189172 A | 8/2009 |
| JP | 2009-538112 A | 10/2009 |
| JP | 2010-63259 A | 3/2010 |
| JP | 2010-63359 A | 3/2010 |
| JP | 2011-69782 A | 4/2011 |
| JP | 2012-37464 A | 2/2012 |

OTHER PUBLICATIONS

U.S. Appl. No. 14/356,785, filed May 7, 2014.
European Search Report dated Jul. 1, 2015 (six (6) pages).
International Search Report with English translation dated Nov. 6, 2012 (5 pages).
Japanese-language Written Opinion (PCT/ISA/237) dated Nov. 6, 2012 (3 pages).
International Search Report dated Jan. 15, 2013 with English translation (five (5) pages).
Japanese-language Written Opinion (PCT/ISA/237) dated Jan. 15, 2013 (four (4) pages).
Japanese Office Action dated Mar. 3, 2015 (four (4) pages).
Chinese Office Action issued in counterpart Chinese Application No. 201280054874.4 dated Jun. 30, 2015 (eight (8) pages).
Takahashi et al., "Development of Noise Solution Type BCW for VRLA Batteries (BCW)", FB Technical News No. 63, The Furukawa Battery Co., Ltd. Nov. 2007, pp. 32-37, including partial English translation.
International Search Report dated Aug. 28, 2012 w/ English translation (four (4) pages).
Japanese-language Written Opinion (PCT/ISA/237) dated Aug. 28, 2012 (four (4) pages).

* cited by examiner

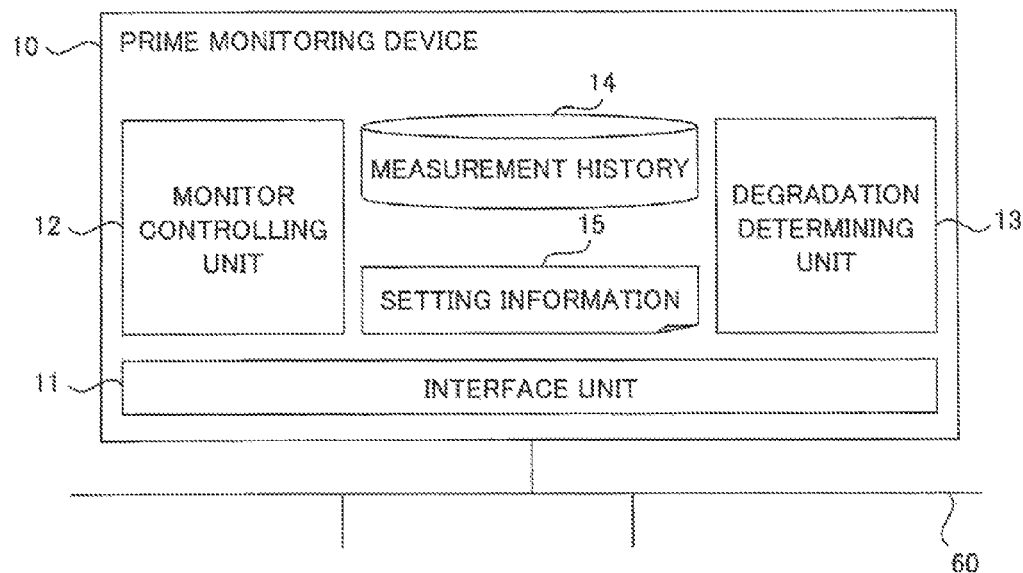
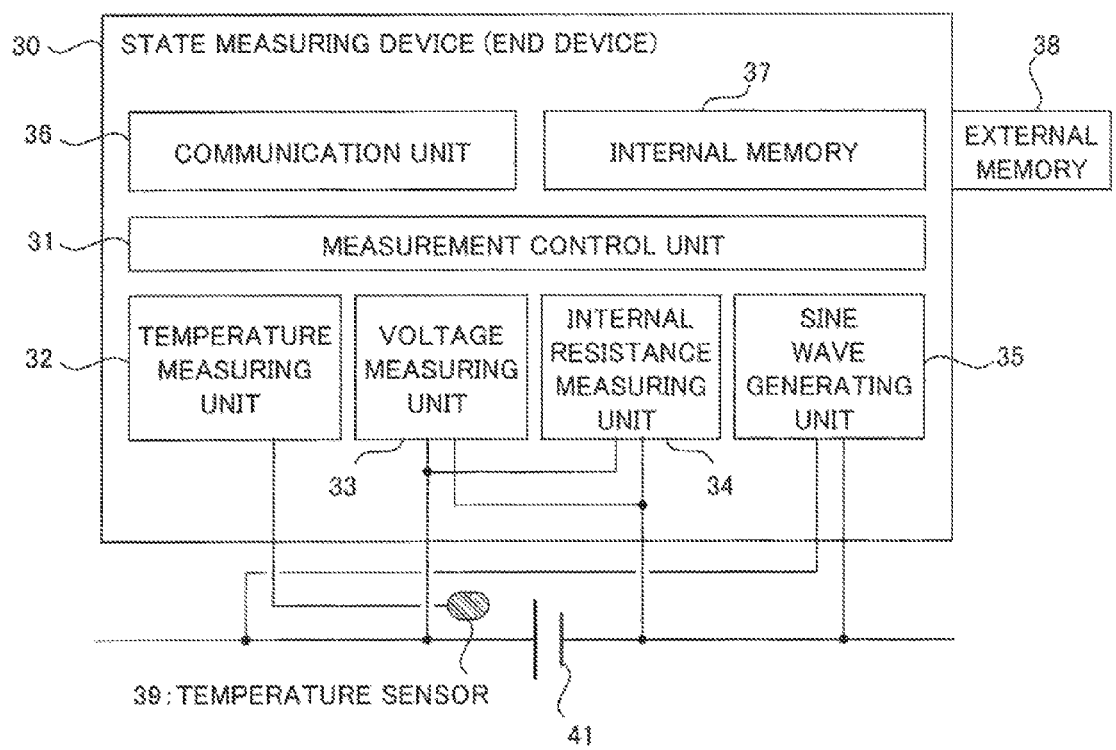

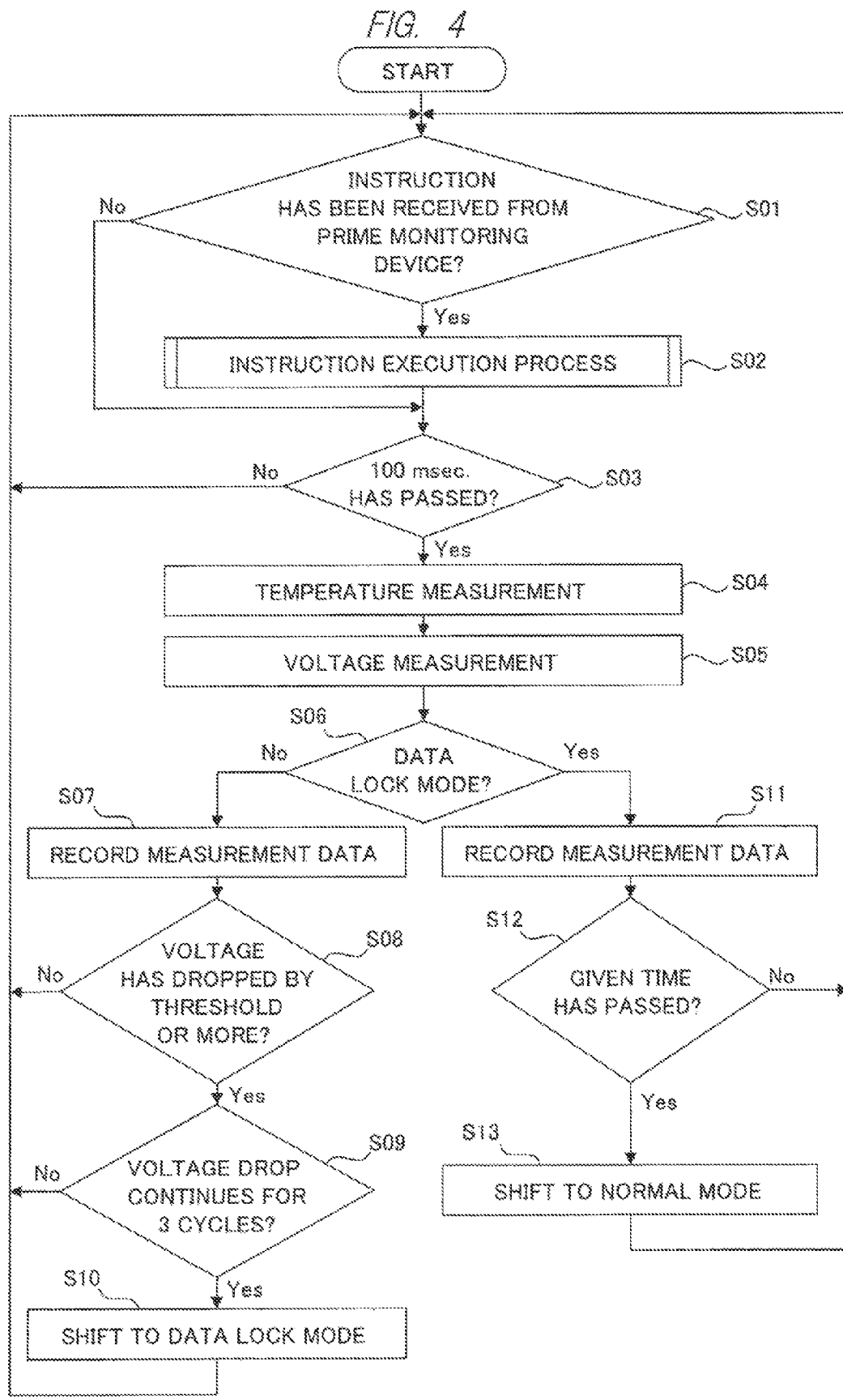

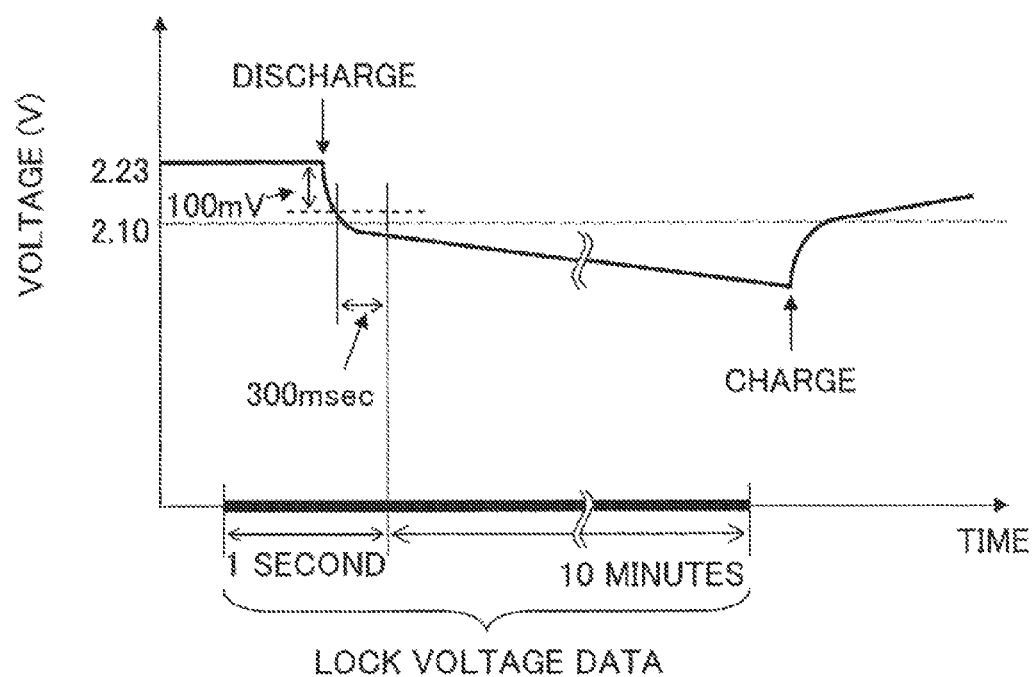

BATTERY-STATE MONITORING SYSTEM

TECHNICAL FIELD

The present invention relates to a technique for monitoring the state of a storage battery, and particularly relates to a technique effectively applied to a battery-state monitoring system in which a state of a storage battery constantly connected to an equipment for use in backup power, output variation and others is monitored and estimated by applying electric power thereto.

BACKGROUND ART

In an important apparatus, system or the like required to be constantly in operation, a USP (Uninterruptible Power Supply) is used in some cases in order to continue the power supply to a load even when power supply from a commercial power source is interrupted due to blackout or instantaneous power interruption (or power from a commercial power source is not or cannot be used and these cases are hereinafter collectively referred to as "emergency situation, etc."). The UPS has a storage battery which stores power to be supplied to the load in an emergency situation, etc., and one UPS may have a plurality of storage batteries.

The storage battery used in the UPS is kept charged and does not operate (discharge) in a normal situation, but operates and supplies power to the load in an emergency situation, etc. It is known that the storage battery degrades over time even in a non-operation state and its degradation is accelerated generally when an ambient temperature is high. Therefore, in the equipment having a storage battery such as the UPS, in order to prevent the occurrence of the case in which the equipment does not operate normally due to the dead battery or the failure of the storage battery, the state of the storage battery is monitored and the remaining battery life is predicted in consideration of the degradation due to the ambient temperature and the service years, and the storage battery is replaced with a new storage battery before the battery reaches the predicted end of the battery life of course when the battery is in a faulty state and even when the storage battery is still in a normal state.

However, in the simple prediction of the remaining life based on the relation between the temperature and a degree of the degradation, since the precision of the prediction of the remaining life is not so high, the storage battery is replaced considerably earlier than the actual end of battery life when taking the safety margin into consideration, and the battery is not used up effectively until the actual end in some cases, so that the use is not efficient from the viewpoint of both of economical use and effective use.

As a technique for solving such a problem, for example, Japanese Patent Application Laid-Open Publication No. 2005-26153 (Patent Document 1) discloses a storage battery monitoring system which detects the temperature T of an assembled battery composed of a plurality of storage batteries, measures the voltage E and the internal resistance R of each storage battery, and determines the service life of each storage battery based on the results of the detection and measurement, so that the end of service life of the storage battery can be accurately determined at high precision while considering other elements in addition to the relation between the temperature and the service life.

Also, the Non-Patent Document 1 describes a battery diagnostic apparatus in which, in order to monitor the state of a lead storage battery used in UPS, the cell voltage, the internal impedance, and the temperature are consecutively measured, and in the measurement of the internal impedance, the internal impedance is measured by using a frequency different from a frequency component of a ripple current generated from the UPS, thereby suppressing the influence of normal mode noises generated from the UPS and stably obtaining the measurement values of the internal impedance.

PRIOR ART DOCUMENTS

Patent Documents

Patent Document 1: Japanese Patent Application Laid-Open Publication No. 2005-26153

Non-Patent Documents

Non-Patent Document 1: Kiyoshi Takahashi, Shigeru Nagashima, "Development of Noise Solution type Battery Condition Watcher (BCW)" FB Technical News No. 63 (2007/11), THE FURUKAWA BATTERY CO., LTD, November 2007, pp. 32 to 37

SUMMARY OF THE INVENTION

Problems to be Solved by the Invention

When the state and service life of the storage battery are estimated, a more accurate estimation is possible by using various parameters in addition to the temperature. Here, when the internal resistance of the storage battery is measured like the case of the above-mentioned conventional technique, a portable measuring device may be used as a simple measuring method. However, the portable measuring device is susceptible to the influence of noises generated from the UPS, and therefore has a problem in its measurement precision. Besides, manual measurement is not efficient in a system having a number of storage batteries such as the UPS, and it is therefore difficult to actually use the portable measuring device for such a measurement.

Hence, as in the cases of Patent Document 1 and Non-Patent Document 1, the apparatus or system that monitors the state of storage batteries is used. In the apparatus and system of Patent Document 1 and Non-Patent Document 1, the internal resistance is measured in addition to the temperature and voltage, but for more accurate estimation of the service life, increase in the number of measurement parameters such as data of charging and discharging in an emergency situation, etc., is required.

For example, a more accurate estimation of the service life in correspondence to various degradation modes of the storage battery is possible when a plurality of frequencies are used for the measurement of the internal resistance instead of using a single frequency like the case of the above-mentioned conventional technique. Herein, although there is a device capable of measuring the internal resistance by using a plurality of frequencies while varying the measurement frequency for respective storage batteries, the application of this device to the measurement of a number of storage batteries included in the UPS is difficult in practice like the case of the portable measuring device. For simultaneously monitoring the states of a number of storage batteries, at least processing related to parameter measurement and data recording must be automated.

Therefore, an object of the present invention is to provide a battery-state monitoring system capable of efficiently estimating the state and service life of each storage battery at high precision by automatically measuring or acquiring various parameters of a plurality of storage batteries constantly connected to an equipment.

The above and other objects and novel characteristics of the present invention will be apparent from the description of the present specification and the accompanying drawings.

Means for Solving the Problems

The following is a brief description of an outline of the typical invention disclosed in the present application.

A battery-state monitoring system according to a typical embodiment of the present invention is a battery-state monitoring system which monitors a state of each of a plurality of storage batteries connected in series and constituting an assembled battery incorporated in an equipment, and the system includes: current detecting device which detects a current in each of the storage batteries; and state measuring device which measures a temperature, a voltage, and internal resistance of each of the storage batteries, the internal resistance being measured by using at least two or more kinds of frequencies, and degradation of each of the storage batteries is estimated based on at least one or more values of the temperature, the voltage, and the internal resistance measured by the state measuring device and a DC resistance of each of the storage batteries obtained from a ratio between a change in a current value detected by the current detecting device and a change in a voltage value measured by the state measuring device during discharging of each of the storage batteries.

Effects of the Invention

The effects obtained by typical embodiments of the invention disclosed in the present application will be briefly described below.

According to a typical embodiment of the present invention, it is possible to estimate the state and service life of each storage battery at high precision by automatically measuring or acquiring various parameters of a plurality of storage batteries constantly connected to an equipment. Furthermore, it is possible to efficiently estimate the state and service life of a number of storage batteries.

BRIEF DESCRIPTIONS OF THE DRAWINGS

FIG. 2 is a schematic diagram of a configuration example of a prime monitoring device according to the one embodiment of the present invention;

FIG. 3 is a schematic diagram of a configuration example of a state measuring device (end device) according to the one embodiment of the present invention;

FIG. 4 is a flowchart schematically showing an example of a process flow in a measurement control unit of the state measuring device (end device) according to the one embodiment of the present invention;

FIG. 5 is a schematic diagram of an example of a voltage change at the time of charging and discharging of a storage battery according to the one embodiment of the present invention.

BEST MODE FOR CARRYING OUT THE INVENTION

Figure 1:
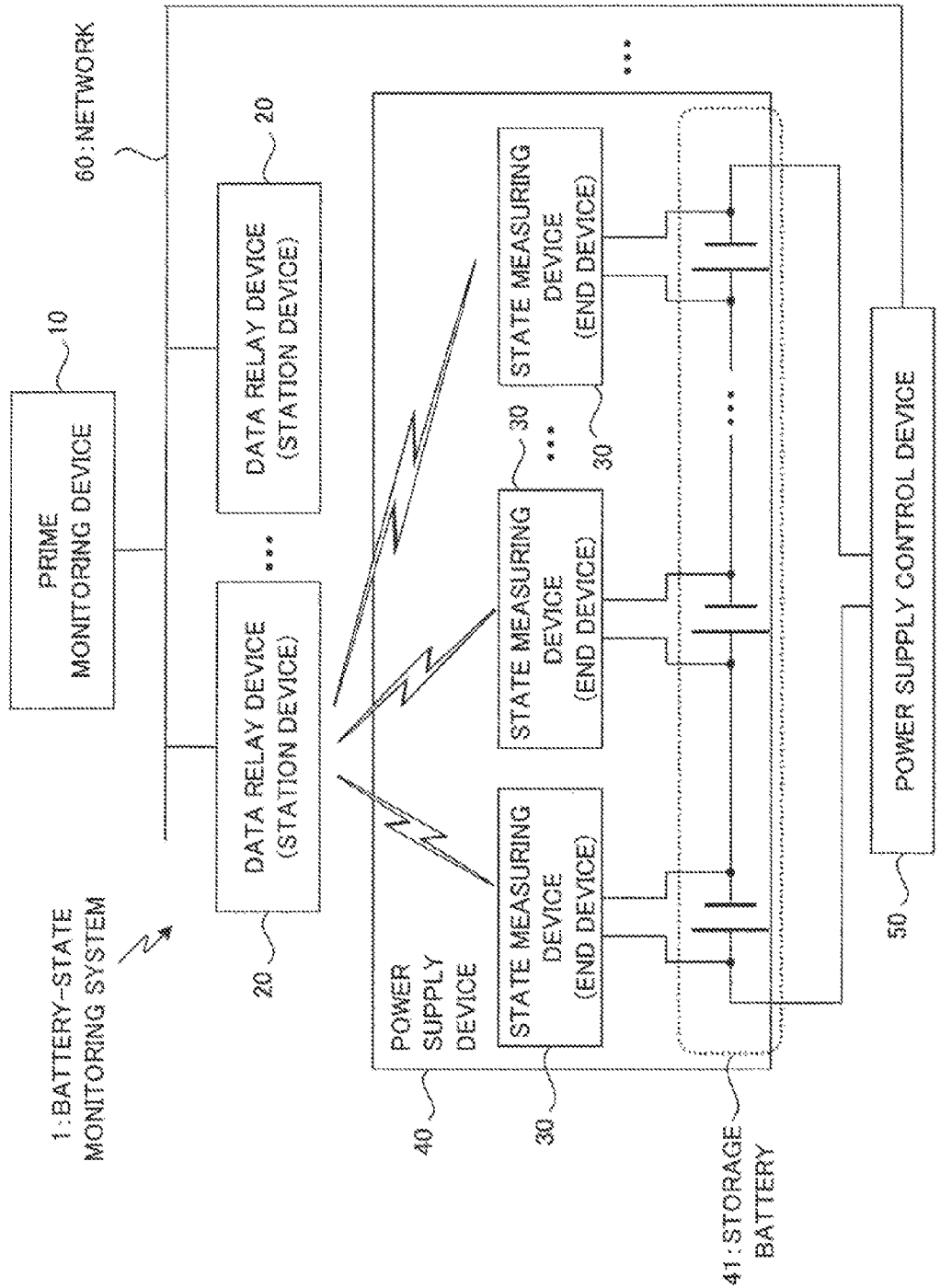
FIG. 1 is a schematic diagram of a configuration example of a battery-state monitoring system according to one embodiment of the present invention.

Hereinafter, embodiments of the present invention will be described in detail with reference to the accompanying drawings. Note that components having the same function are denoted by the same reference symbols throughout the drawings for describing the embodiments, and the repetitive description thereof will be omitted in principle.

SUMMARY

In a battery-state monitoring system according to one embodiment of the present invention, various parameters of a plurality of storage batteries constantly connected to an equipment and constituting an assembled battery which is included in a UPS or the like are automatically measured or acquired by supplying electric power to the storage batteries, thereby estimating the state and service life of each storage battery.

Each storage battery is provided with a measuring device which measures various parameters to acquire and save measurement data, and the data measured by the measuring device is transmitted to a monitoring device in response to a request. The monitoring device comprehensively carries out the process of estimating the state and service life of the storage battery based on the measurement data collected from each measuring device, and the monitoring device has an interface through which, when there is a storage battery which needs to be replaced, the user is informed of the need of replacement of the storage battery together with related information and others.

In this embodiment, in consideration of the reduction in communication loads due to that the monitoring device has communication sessions with many measuring devices and the easiness and flexibility of the installation of measuring devices resulting from utilizing radio communication, a hierarchical configuration is adopted, in which a relay device for distributing communication loads and/or converting a communication protocol is provided between the monitoring device and the measuring device.

In the battery-state monitoring system of this embodiment, when making a determination on the degradation of the storage battery, the degradation is determined from various aspects based on a plurality of parameters such as the voltage, internal resistance (which is mainly AC impedance and includes the battery reactance at the time of measurement, but will hereinafter be collectively referred to as "internal resistance") and DC resistance during charging and discharging in addition to the determination based on the temperature of the storage battery. For example, with regard to the temperature and voltage, as the management of the abnormal values including those caused by an unexpected fault and others, the system determines that the storage battery is in an abnormal state when the value of temperature or voltage of the storage battery acquired at a fixed interval (e.g., 5 minutes) exceeds a given threshold. Specifically, for example, when the temperature of the storage battery exceeds the room temperature by +10° C., the system determines that the storage battery is in a slight abnormal state, and when the temperature of the storage battery exceeds the room temperature by +20° C., the system determines that the storage battery is in a state where immediate replacement is needed. Also, the end of the service life may be determined based on a table or equation indicating the correlation between the temperature and the service life.

Also, as a tendency management in a normal situation, the internal resistance is measured at regular cycles such as once a day or at the time of reception of a user instruction, and the degradation of the storage battery is estimated based on the change rate from an initial value of internal resistance (e.g., an internal resistance value measured for the first time at the installation of the storage battery). For example, when the internal resistance value of the storage battery increases from its initial value by 20% or more, the system determines that the storage battery is in a slightly degraded state, when the internal resistance value increases from its initial value by 50% or more, the system determines that the storage battery needs to be replaced in an early opportunity (e.g., within a year), and when the internal resistance value increases from its initial value by 100% or more, the system determines that the storage battery must be replaced immediately. Since the absolute values of internal resistance vary depending on the type of storage batteries, determination based on relative values is carried as described above.

In this embodiment, in order to estimate the service life more accurately in correspondence to various degradation modes of the storage battery, the internal resistance is measured by using a plurality of frequencies, and the above-mentioned determination based on a relative value to the initial value is carried out for each internal resistance measured at each frequency. A conventional measuring device of an internal resistance usually uses a frequency of about 1 kHz, and it is known that the gradual degradation of the storage battery can be determined to some extent based on the internal resistance measured at this frequency. Also, since this frequency has been used widely and lots of reference data involving the frequency have been accumulated, the frequency of about 1 kHz (e.g., 350 Hz or higher to lower than 2000 Hz) is used as one of the frequencies in this embodiment.

Meanwhile, the frequency of about 1 kHz is too high as a frequency for obtaining information about a power-generating element such as an electrode reaction, and just the information merely capable of determining whether the storage battery is dead or alive can be obtained. Therefore, for obtaining more detailed information, it is preferable to measure the internal resistance at a frequency of direct current or a lower frequency close to a direct current. In this embodiment, a DC resistance component is acquired by automatically detecting the timing at which the UPS is operated and the storage battery starts charging and discharging and calculating a ratio of respective changes (slope) of a current value and a voltage value during discharging based on a voltage value and a current value (larger than those at the measurement of internal resistance at AC) sequentially measured during the charging or discharging of the storage battery by the measuring devices installed for respective storage batteries. By comparing that with the initial value in the same manner as described above, the degradation of the storage battery can be determined more accurately.

However, since equipment such as the UPS usually stands by or is not in operation in a normal situation, there is only a limited timing for measuring the DC resistance in the above-mentioned manner. For this reason, in this embodiment, the internal resistance at low frequency is also measured in the normal situation (in which the storage battery is not charging or discharging). For example, a frequency of lower than 100 Hz is used because the frequency brings no actual problem to the configuration of the system and does not interfere with the commercial power source (is not integer multiple of 50 Hz or 60 Hz). For the further improvement of the precision of the degradation determination, it is preferable to measure the internal resistance by using additional different frequencies.

Therefore, in this embodiment, frequencies for measuring the internal resistance include at least the high frequency of about 1 kHz (e.g., 350 Hz or higher to lower than 2000 Hz) and the low frequency of less than 100 Hz (which does not interfere with the commercial power source) and further include a middle frequency (e.g., 100 Hz or higher to lower than 350 Hz) different from those frequencies, and the internal resistance is measured by using these three kinds of frequencies as described later.

For more general description, for example, by measuring the internal resistance by using a plurality of frequencies obtained by selecting at least one or more frequencies from the low-frequency range of lower than 200 Hz and the high-frequency range of 200 Hz or higher to lower than 2000 Hz, the precision of degradation determination can be improved. The precision of degradation determination can be further improved by measuring the internal resistance by adding other frequencies selected from the above-mentioned frequency ranges.

In this manner, by determining the degradation from various aspects based on one or more parameters of a plurality of parameters including the temperature, voltage, internal resistance, DC resistance during charging and discharging and others, the state and service life of the storage battery can be estimated at high precision.

<System Configuration>

FIG. 1 is a schematic diagram of a configuration example of a battery-state monitoring system according to one embodiment of the present invention. In a battery-state monitoring system 1, various parameters of a plurality of storage batteries 41 connected in series and constituting an assembled battery which is incorporated in an equipment such as a power supply device 40 are automatically measured or acquired, thereby estimating the state and service life of each storage battery 41. The battery-state monitoring system 1 includes state measuring devices 30 each of which is fixedly installed to each storage battery 41 of one or more power supply devices 40 and measures various parameters of the storage battery 41 and a prime monitoring device 10 which collects measurement data from the state measuring devices 30 and comprehensively carries out a process of estimating the state and service life of the storage battery 41. The battery-state monitoring system 1 further includes data relay devices 20 which are disposed between the prime monitoring device 10 and the state measuring devices 30 and relay the measurement data transmitted from the state measuring devices 30 to the prime monitoring device 10.

More specifically, in this embodiment, the storage-battery monitoring system 1 has a three-layer hierarchical configuration in which M data relay devices 20 (which may be hereinafter referred to as "station device") are connected to one prime monitoring device 10 so as to enable communication therebetween and N state measuring devices 30 (which may be hereinafter referred to as "end device") are connected to each data relay device 20 so as to enable communication therebetween. The prime monitoring device 10 and the station devices 20 are connected by a wired communication via a network 60 such as LAN (Local Area Network), and the station devices 20 and the end devices 30 are connected by a radio communication. Standards, protocols, and others for the wired and radio communications are not particularly limited and known techniques can be used properly.

In this manner, in an equipment such as the power supply device 40 having a number of storage batteries 41, since the end devices 30 can be installed for the storage batteries 41 without providing external wirings and others, the easiness and flexibility of device installation can be improved and the devices can be installed more efficiently, so that risks of trouble caused by erroneous wire connection, time-dependent degradation of wirings and others can be reduced.

In this embodiment, each station device 20 has at least a function of converting a communication protocol between the radio communication with the end devices 30 and the wired communication with the prime monitoring device 10, but the station device 20 does not need to have other functions. The station device 20 may carry out the radio communication with each end device 30 simultaneously or sequentially. Further, depending on the scale of the battery-state monitoring system 1 (e.g., the number of storage batteries 41 to be monitored), the battery-state monitoring system 1 may have a two-layer configuration in which no station device 20 is present and the end devices 30 communicate directly with the prime monitoring device 10, and the communication between the end devices 30 and the station devices 20 (or the prime monitoring device 10) is not limited to radio communication and may be replaced with wired communication.

To each power supply device 40, a power supply control device (power conditioning system (PCS), uninterruptible power supply (UPS) or DC power supply) 50 which controls power supply to a load such as the apparatus or system utilizing the power supply device 40 is connected. The power supply control device 50 controls the power supply from the power supply device 40 to the load and has a function as a current detector capable of detecting a current value flowing through the storage batteries 41 connected in series in the power supply device 40, and thus can acquire the information about the presence/absence of charging and discharging of the power supply device 40 (storage battery 41). The power supply control device 50 is connected to, for example, the network 60, and the prime monitoring device 10 can acquire the information about the current value and the presence/absence of charging and discharging of the storage battery 41 of the power supply device 40 from the power supply control device 50 via the network 60.

In the configuration of this embodiment, the power supply control device 50 detects the current value of each storage battery 41 and the prime monitoring device 10 can acquire the information from the power supply control device 50. However, the configuration is not limited thereto, and it is also possible to adopt the configuration in which the end device 30 described later measures the current value of each storage battery 41 in the same manner as the measurement of other parameters such as temperature and voltage and transmits the information thereof to the prime monitoring device 10.

FIG. 2 is a schematic diagram of a configuration example of the prime monitoring device 10. The prime monitoring device 10 collects information of various parameters measured with respect to each storage battery 41 from each end device 30 through the station device 20 and estimates the state and service life of each storage battery 41 based on the collected information, thereby monitoring the presence/absence of an abnormal state and the arrival of the end of its service life.

The prime monitoring device 10 is constituted of, for example, an information processing device such as a PC (Personal Computer), server or the like and includes an interface unit 11, a monitor controlling unit 12, and a degradation determining unit 13, which are incorporated as software programs running on middleware such as OS (Operating System) and DBMS (Database Management System) (not shown). Also, the prime monitoring device 10 further includes a measurement history 14 serving as a database that stores measurement data collected from the end device 30 and setting information 15 made up of files, registries and others saving various settings related to the operation of the battery-state monitoring system 1.

The interface unit 11 has a function of user interface for providing a screen with which the user inputs various instructions and a screen by which the monitoring result of the state of the storage battery 41 is displayed for the user. It is also possible to adopt the configuration in which the screen is displayed by having an access from a Web browser on the client terminal of a user by a Web server program (not shown). The various instructions input by the user include, for example, an instruction to specify operation conditions for the prime monitoring device 10 and the end device 30 that are set as the setting information 15 and an instruction to measure and collect data to the end device 30 based on a request from the user.

The monitor controlling unit 12 sends a request for specifying conditions for measurement of various parameters and executing the measurement to the end device 30 (through the station device 20) in accordance with the setting contents registered in the setting information 15 or an instruction from the user through the interface unit 11. Also, the monitor controlling unit 12 has a function of collecting measurement data by requesting the end device 30 to transmit the measurement data of various parameters and accumulating the measurement data of each storage battery 41 by recording the data in the measurement history 14.

When there are a number of storage batteries 41 to be monitored, for example, if a data measurement instruction is sent simultaneously to the end devices 30, the end devices 30 carry out the measurement for the storage batteries 41 simultaneously. Since the end device 30 applies an electric power to the storage battery 41, though it is minute, at the time of the measurement of parameters, the voltage drop occurs, and it may therefore exert an adverse effect on the power supply device 40 if a number of end devices 30 simultaneously carry out the measurement. Also, when a transmission request of measurement data is sent simultaneously to the end devices 30, the end devices 30 transmit the measurement data simultaneously to the prime monitoring device 10 through the station devices 20, with the result that a large communication load may be applied on the station device 20 and the prime monitoring device 10.

Therefore, in this embodiment, when instructions to measure various parameters (in particular, measurement of the internal resistance), transmit the measurement data and others are sent to the end devices 30, the end devices 30 are divided into groups each consisting of a proper number of end devices 30 (e.g., 30% of the entire end devices 30), and the instruction is sent automatically or manually to each group of the end devices 30 with sufficient time differences so that timings of processing by the end devices 30 belonging to respective groups do not overlap each other.

The degradation determining unit 13 estimates the state and service life of the storage battery 41 by determining the degradation of the storage battery 41 from various aspects by the above-mentioned method in accordance with the setting contents registered in the setting information 15 or an instruction from the user through the interface unit 11 based on the measurement values of various parameters such as the temperature, voltage, internal resistance and others collected from the end devices 30 and recorded in the measurement history 14 and the current values and others at the time of charging and discharging in the power supply device 40 acquired from the power supply control device 50.

In this embodiment, as described above, the degradation of the storage battery 41 is estimated at mainly three timings. Firstly, the abnormality including an unexpected failure and the service life of the storage battery 41 are estimated based on acquired data of the temperature and voltage measured consecutively at fixed time intervals (5 minutes in this embodiment). Secondly, the degradation tendency of the storage battery 41 in a plurality of degradation modes is estimated based on the measurement values of internal resistance measured by using a plurality of frequencies at regular cycles (once a day in this embodiment) or arbitrary timing in accordance with an instruction from the user. Thirdly, the degradation tendency of the storage battery 41 is estimated at higher precision at the timing of discharging or charging of the storage battery 41 based on DC resistance calculated from measurement data of the voltage at the discharging or charging and a DC current value at the discharging or charging acquired from the power supply control device 50.

The initial values of the internal resistance and DC resistance may be acquired from the first measurement data of the storage battery 41 to be measured in the measurement history 14 or may be separately recorded for each storage battery 41.

When it is determined as a result of the estimation of the state and degradation of the storage battery 41 that the end of service life of the storage battery 41 has arrived or the storage battery 41 must be replaced because the end of its service life is near, for example, the determination is imparted together with information of measurement data, estimation result, and others to the user through the interface unit 11.

In the setting information 15, as setting contents related to the operation of the battery-state monitoring system 1, for example, an interval of measurement of the temperature and voltage by the end device 30 (e.g., 10 to 200 msec. and 100 msec. in this embodiment), an interval of collection of measurement data of temperature and voltage measurement data by the prime monitoring device 10 (e.g., 5 minutes), and a cycle of measurement of the internal resistance (e.g., once a day) may be set or changed by the user, administrator and others. In addition, as described later, a threshold of voltage drop and the number of consecutive cycles based on which the end device 30 detects discharging of the power supply device 40 (storage battery 41), information of a time range during which voltage measurement data is locked when discharging is detected, and the operation mode of the end device 30 (normal mode, power-saving mode) and the like may also be set as setting information.

By saving the settings related to the operation of the end device 30 in the setting information 15 of the prime monitoring device 10 so as to make it possible to specify the settings to the end device 30 from the monitor controlling unit 12, separate works to a number of end devices 30 become unnecessary, and operation conditions of the end devices 30 can be specified and changed efficiently by an instruction from the prime monitoring device 10.

FIG. 3 is a schematic diagram of a configuration example of the state measuring device (end device) 30. One end device 30 is fixedly installed to a lid or the like of one storage battery 41, measures and records various parameters of the storage battery 41, and transmits measurement data to the prime monitoring device 10 through the station device 20 in response to an instruction from the prime monitoring device 10 through the station device 20. Since the end device 30 is fixedly installed to the storage battery 41, wiring connection with the terminals, sensors and others for measuring various parameters can be stabilized, and the variations in measurement data can be reduced. Usually, one end device 30 is installed to one storage battery 41, but depending on the cost and the voltage of the storage battery 41, some storage batteries 41 connected in series may be collectively monitored by one end device.

The end device 30 includes a measurement control unit 31, a temperature measuring unit 32, a voltage measuring unit 33, an internal resistance measuring unit 34, and a sine wave generating unit 35, which are incorporated as software programs executed by a CPU (Central Processing Unit), circuits, and others. Also, the end device 30 further includes a communication unit 36 which carries out radio communication with the station device 20 and an internal memory 37 which is a memory device composed of a nonvolatile semiconductor memory or the like. Furthermore, a temperature sensor 39 extended from the temperature measuring unit 32 is disposed on the storage battery 41, and terminals extended from the voltage measuring unit 33, internal resistance measuring unit 34, and sine wave generating unit 35 are connected to the positive and negative terminals of the storage battery 41, respectively. Note that the power to operate the end device 30 is supplied from the storage battery 41. Therefore, it is preferable that the end device 30 has a power-saving mode or the like in which the end device 30 sleeps so as not to consume power unnecessarily except a time when power is required for operating each unit.

The measurement control unit 31 has a function of controlling entire processing in the end device 30 such as the measurement of various parameters in the end device 30 and recording and transmission of measurement data. Each measuring unit constantly monitors the storage battery 41 (e.g., at the measurement interval of 100 msec. and the measurement cycle of once a day) and sequentially records the measurement data in a given area of the internal memory 37. At this time, old measurement data is overwritten to use the area cyclically. Also, the communication unit 36 carries out radio communication with the station device 20, and measurement data is transmitted to the prime monitoring device 10 through the station device 20 based on an instruction from the prime monitoring device 10 sent through the station device 20. Measurement data recorded in the internal memory 37 can be taken out by copying or transferring it to an external memory 38 composed of a semiconductor memory or the like attached to the end device 30. Also, the external memory 38 may be used as a memory area equivalent to the internal memory 37.

The temperature measuring unit 32 measures the temperature of the storage battery 41 by using the temperature sensor 39 and outputs the measurement data to the measurement control unit 31 in accordance with an instruction from the measurement control unit 31 (e.g., at every 100 msec.). Similarly, the voltage measuring unit 33 measures a voltage between the terminals of the storage battery 41 and outputs the measurement data to the measurement control unit 31 in accordance with an instruction from the measurement control unit 31 (e.g., at every 100 msec.). At this time, as described later, when a drop (or rise) in the voltage value continues for a given period or longer, the measurement control unit 31 determines that the storage battery 41 is discharging (or is being charged), and locks (protects) the voltage measurement data obtained in a given period before and after the start of discharging (or charging) so that the data is not overwritten with other data and lost in the internal memory 37.

The internal resistance measuring unit 34 measures internal resistance between the terminals of the storage battery 41 and outputs the measurement data to the measurement control unit 31 in response to an instruction from the measurement control unit 31 (e.g., once a day). In this measurement, the sine wave generating unit 35 generates sine waves of a plurality of frequencies as described above and current (e.g., 3 A or less) at respective frequencies is applied to the storage battery 41. Based on the measurement data of the current value at that time and the voltage value between the terminals, the internal resistance at respective frequencies is calculated.

As described above, for example, the precision of the degradation determination can be improved by measuring the internal resistance by using a plurality of frequencies obtained by selecting one or more frequencies from the low-frequency range of lower than 200 Hz and the high-frequency range of 200 Hz or higher to lower than 2000 Hz, respectively. By measuring the internal resistance by adding other frequencies in the above-mentioned frequency ranges, the precision can be further improved. In this embodiment, for example, three kinds of frequencies selected from the high-frequency range of about 1 kHz (e.g., 350 Hz or higher to lower than 2000 Hz) and the low-frequency range of lower than 100 Hz (which does not interfere with the commercial power source) and further the middle-frequency range (e.g., 100 Hz or higher to lower than 350 Hz) different from those frequency ranges are used to measure the internal resistance.

In order to confirm the effects obtained by the measurement using a plurality of frequencies, an example of experimental results is shown in a table below. In this example, the internal resistance of storage batteries is actually measured and the service life thereof is evaluated (battery capacity is estimated) for the respective cases in which the conventional measuring device of internal resistance (which measures the resistance by using a single frequency) is used and in which the state measuring device 30 of this embodiment (in which the internal resistance measuring unit 34 measures the resistance by using a plurality of frequencies) is used.

TABLE 1

| | Items | Conventional Product 1 | | Conventional Product 2 | | Conventional Product 3 | | Developed Product 1 | | Developed Product 2 | |
|---|---|---|---|---|---|---|---|---|---|---|---|
| Measuring Conditions | High-Frequency Range | 350~2000 Hz | | | | | | 200~2000 Hz | | 350~2000 Hz | |
| | Middle-Frequency Range | | | 100~350 Hz | | | | | | 100~350 Hz | |
| | Low-Frequency Range | | | | | 0~100 Hz | | 0~200 Hz | | 0~100 Hz | |

| | Battery | Relative Ratio of Actual Capacity (%) | | Relative Ratio of Estimated Value (%) | | Relative Ratio of Estimated Value (%) | | Relative Ratio of Estimated Value (%) | | Relative Ratio of Estimated Value (%) | | Relative Ratio of Estimated Value (%) | |
|---|---|---|---|---|---|---|---|---|---|---|---|---|---|
| | Type | 5HR | 1CA | 5HR | 1CA | 5HR | 1CA | 5HR | 1CA | 5HR | 1CA | 5HR | 1CA |
| Battery Type, Actual Capacity and Estimated Value | Battery A | 100 | 100 | 105 | 98 | 105 | 105 | 95 | 105 | 100 | 100 | 100 | 100 |
| | Battery B | 90 | 95 | 95 | 90 | 100 | 100 | 100 | 100 | 90 | 95 | 90 | 95 |
| | Battery C | 95 | 75 | 90 | 95 | 80 | 80 | 80 | 80 | 95 | 80 | 95 | 75 |
| | Battery D | 80 | 40 | 85 | 80 | 60 | 60 | 50 | 50 | 80 | 45 | 80 | 40 |
| | Battery E | 100 | 85 | 95 | 100 | 90 | 90 | 90 | 90 | 100 | 80 | 100 | 85 |
| | Battery F | 95 | 60 | 90 | 95 | 70 | 70 | 70 | 70 | 100 | 60 | 95 | 60 |

| | Battery | Relative Ratio of Actual Capacity (%) | | Error from Actual Capacity | | Error from Actual Capacity | | Error from Actual Capacity | | Error from Actual Capacity | | Error from Actual Capacity (%) | |
|---|---|---|---|---|---|---|---|---|---|---|---|---|---|
| | Type | 5HR | 1CA | 5HR | 1CA | 5HR | 1CA | 5HR | 1CA | 5HR | 1CA | 5HR | 1CA |
| Battery Type and Error between Actual Capacity and Estimated Value | Battery A | 100 | 100 | 5 | 2 | 5 | 5 | 5 | 5 | 0 | 0 | 0 | 0 |
| | Battery B | 90 | 95 | 5 | 5 | 10 | 5 | 10 | 5 | 0 | 0 | 0 | 0 |
| | Battery C | 95 | 75 | 5 | 20 | 15 | 5 | 15 | 5 | 0 | 5 | 0 | 0 |
| | Battery D | 80 | 40 | 5 | 40 | 20 | 20 | 30 | 10 | 0 | 5 | 0 | 0 |
| | Battery E | 100 | 85 | 5 | 15 | 10 | 5 | 10 | 5 | 0 | 5 | 0 | 0 |
| | Battery F | 95 | 60 | 5 | 35 | 25 | 10 | 25 | 10 | 5 | 0 | 0 | 0 |
| Applicability of Each Item | Error Subtotal | | | 30 | 117 | 85 | 50 | 95 | 40 | 5 | 15 | 0 | 0 |
| | Error Total | | | 147 | | 135 | | 135 | | 20 | | 0 | |
| | Measurement Time | | | 100 | | 500 | | 2500 | | 500 | | 300 | |
| | Evaluation Score (Time + Error × 10) | | | 1570 | | 1850 | | 3850 | | 700 | | 300 | |
| | Evaluation | | | Normal | | Inferior | | Inapplicable | | Good | | Excellent | |

The table 1 indicates the results of evaluation of the measurement precision based on the error between the actual battery capacity and the estimated battery capacity and the time required for the measurement obtained by measuring the internal resistance of the storage batteries having different degradation states and estimating the battery capacities thereof by using the conventional products 1 to 3 and the developed products 1 and 2.

Here, the conventional products 1 to 3 are the measuring devices each of which measures the internal resistance by using a single frequency according to the conventional technique, and the measurement frequencies of these measuring devices belong to the respectively different ranges (high-frequency range (350 Hz or higher to lower than 2000 Hz), middle-frequency range (100 Hz or higher to lower than 350 Hz) and low-frequency range (lower than 100 Hz)). Meanwhile, the developed products 1 and 2 are the state measuring devices 30 of this embodiment, and they measure the internal resistance by using measurement frequencies which belong to a plurality of frequency ranges (high-frequency range (200 Hz or higher to lower than 2000 Hz) and low-frequency range (lower than 200 Hz) for the developed product 1 and high-frequency range (350 Hz or higher to lower than 2000 Hz), middle-frequency range (100 Hz or higher to lower than 350 Hz) and low-frequency range (lower than 100 Hz) for the developed product 2).

Six types of storage batteries (batteries A to F) have been fabricated as storage batteries to be used in the experiments. These batteries are:

battery A that is a new battery conforming to storage battery standards UP300-12 (12 V/100 Ah/5 HR);

battery B fabricated by reducing the electrolytic solution of a battery equivalent to the battery A by 10%;

battery C fabricated by subjecting a battery equivalent to the battery A to a trickle charge life test conducted at 25° C. which gives the battery an effect of 5-year time-dependent degradation;

battery D fabricated by subjecting a battery equivalent to the battery A to a trickle charge life test conducted at 25° C. which gives the battery an effect of 15-year time-dependent degradation;

battery E fabricated by refilling a battery equivalent to the battery C with a decreased amount of the electrolytic solution; and battery F fabricated by refilling a battery equivalent to the battery D with a decreased amount of the electrolytic solution.

In the table, as the conditions of each of the above-mentioned batteries, based on the 5HR capacity and 1CA capacity, the actual capacities and the estimated capacity values obtained based on the measurement values of the internal resistance by the conventional products 1 to 3 and the developed products 1 and 2 are indicated by the relative ratios (%) to the full-charged capacity.

A storage battery in its fully charged state is prepared in accordance with JIS8704-02, and an actual measurement value of the discharge capacity (actual capacity) of each battery is based on the storage battery. The storage battery in its fully charged state means the storage battery charged with a limiting current of 13.38 V/10 A for 48 hours or longer. For the actual measurement value (actual capacity) of the 5HR capacity, a storage battery after being charged is left in its open-circuit state in an atmosphere of 25±2° C. for 24 hours and the battery is then discharged with a discharge current value of 20 A under a temperature of 25±2° C., and the discharge capacity is obtained from a discharge duration time required to reach its final voltage of 10.5 V. Also, for the actual measurement value (actual capacity) of the 1CA capacity, like the case of the 5HR capacity mentioned above, a storage battery after being fully charged is left in an atmosphere of 25±2° C. for 24 hours and the battery is then discharged with a discharge current value of 100 A, and the discharge capacity is obtained from a discharge duration time required to reach its final voltage of 9.6 V. The relative ratios of the obtained actual measurement values of the discharge capacity of each storage battery to the discharge capacity of a new battery are calculated.

In the estimation of the capacity based on the measurement value of an internal resistance, an experimental formula regarding the relation between the internal resistance and the discharge capacity (or discharge duration time) which is established as conventional knowledge based on accumulated experimental results is used. Specifically, since the relation between the measurement value of internal resistance and the discharge capacity is expressed by a linear function, for example, the discharge capacity obtained by each of the conventional products 1 to 3 (which measures the internal resistance by using a single frequency) is expressed by the following equation based on the measurement value of internal resistance and the initial value of internal resistance.

Discharge capacity initial value of discharge capacity×(1−(measurement value of internal resistance−initial value of internal resistance)/initial value of internal resistance)

Therefore, the relative ratio to the discharge capacity of a new battery (initial value of discharge capacity) is calculated by the following equation.

Relative ratio=1−(measurement value of internal resistance−initial value of internal resistance)/initial value of internal resistance In the case of measuring the internal resistance by using a plurality of frequencies like the developed products 1 and 2, for example, a weighted mean value obtained by giving a predetermined weight to two or three measured internal resistance values is applied to the above-mentioned equations. For example, in the case of the measurement in the low-rate discharge, a weight heavier than that for an internal resistance measured by using a frequency in the middle-frequency range is set for an internal resistance value measured by using a frequency in the high-frequency range. Also, in the case of the measurement in the high-rate discharge, a weight heavier than that for an internal resistance measured by using a frequency in the high-frequency range is set for an internal resistance value measured by using a frequency in the middle-frequency range, and a weight heavier than that for an internal resistance value measured by using a frequency in the middle-frequency range is set for an internal resistance value measured by using a frequency in the low-frequency range.

In the table 1, for each of the conventional products 1 to 3 and the developed products 1 and 2, an error between an estimated capacity value (relative ratio) obtained based on a measurement value of internal resistance and an actual capacity (relative ratio) is determined for the 5HR capacity and 1CA capacity of each storage battery. In addition, evaluation scores are calculated based on the total of errors and times spent for the measurement of the internal resistance, and evaluation results based on the scores are indicated.

According to the evaluation results, it can be understood that the developed products 1 and 2 can estimate the battery capacity in a shorter time and at higher precision than the conventional products 1 to 3 (which measure the internal resistance by using a single frequency). It is also understood that the developed product 2 (which measures the internal resistance by using three kinds of frequencies) can estimate the battery capacity in a shorter time and at higher precision than the developed product 1 (which measures the internal resistance by using two kinds of frequencies).

<Process Flow in State Measuring Device (End Device)>

FIG. 4 is a flowchart schematically showing an example of a process flow in the measurement control unit 31 of the state measuring device (end device) 30. When the end device 30 is activated to start the measurement process of various parameters of the storage battery 41, it is first determined whether an instruction has been received from the prime monitoring device 10 through the station device 20 (S01). When the instruction has been received, a process specified by the instruction from the prime monitoring device 10 is executed (S02). The instruction execution process at step S02 will be described later.

When no instruction has been received from the prime monitoring device 10 at step S01, it is next determined whether a given interval has passed from the previous measurement cycle (S03). This given interval is the interval at which the end device 30 regularly measures the parameters of the storage battery 41, and is set to, for example, 100 msec. in this embodiment. The value of the interval may be, for example, the value specified by the prime monitoring device 10 through the station device 20, or a value set as a default value in advance to the end device 30 and saved in the internal memory 37 or the like may be referred to at the activation of the end device 30 or other specific timing.

When 100 msec. has not passed at step S03, the flow returns to step S01 and the process is repeated. Instead of step S01, the flow may return to step S03 to wait until 100 msec. passes. When 100 msec. has passed at step S03, the temperature of the storage battery 41 is measured by the temperature measuring unit 32 (S04) and a voltage between the terminals of the storage battery 41 is measured by the voltage measuring unit 33 (S05). At this time, if there is a resistance measuring instruction from the prime monitoring device 10, a voltage is measured by applying a current with a given frequency generated by the sine wave generating unit 35 (e.g., 3 A or less) to the storage battery 41.

When the temperature measuring unit 32 and the voltage measuring unit 33 have measured the temperature and the voltage and the measurement control unit 31 has acquired the measurement data, it is determined whether the current mode is a data lock mode in which the recording is carried out in the state where the measurement data is locked so that it is not overwritten (S06). When the current mode is not the data lock mode but is a normal mode, the measurement data of the temperature and voltage is recorded together with a time stamp in the internal memory 37 (S07). When there is the data locked in the internal memory 37, the measurement data is recorded so as not to delete the locked data by overwriting it.

In the following step, the process to determine whether the storage battery 41 has started discharging or charging by analyzing the measured voltage data is carried out. The storage battery 41 incorporated in the power supply device 40 is controlled so as to maintain a constant voltage in a normal situation. Meanwhile, when the power supply device 40 is activated to start supplying power to a load, that is, the storage battery 41 starts discharging, the voltage of the storage battery 41 drops sharply and then gradually decreases as the discharging goes on (the voltage changes inversely when the power supply device 40 stops supplying power to the load and charging to the storage battery 41 is started).

FIG. 5 is a schematic diagram of an example of a voltage change at the time of charging and discharging of the storage battery 41. FIG. 5 shows a case of discharging and charging of a unit cell of the storage battery 41, in which a voltage per unit cell in the normal situation (e.g., 2.23 V) drops sharply to 2.1 V or lower and then gradually decreases with an almost constant slope. Therefore, in this embodiment, for example, when the state where the voltage has dropped from its normal voltage by 100 mV or more per one cell is continued for consecutive 3 measurement cycles (300 msec.), it is determined that discharging is started.

As described above, since a large DC current flows through the storage battery 41 during the discharging, more detailed information of the state of the storage battery 41 can be obtained based on the parameter measurement data at this time. Therefore, as shown in FIG. 5, as the data during the discharging, the measurement data of voltage (which may include temperature data) in a predetermined time range before and after a point of time when the discharging is detected (time range enough to calculate a change rate (slope) during a gradual decrease of the voltage) is recorded in the internal memory 37 in a locked state so that the recorded data is not lost by being overwritten or deleted by other measurement data (the data during the charging may also be locked in the same manner).

In this embodiment, for example, data in a time range from 1 second before to 10 minutes after a point of time when the discharging is detected is locked. Although this time range can be determined properly in accordance with the capacity of the internal memory 37, a communication load for the data transmission, use conditions of the power supply device 40 and others, it is preferable to save and lock the data in a time range of 1 minute or more after the point of time when the discharging or charging is detected.

For carrying out the above-mentioned process, in the process flow of FIG. 4, it is first determined whether the measurement value of voltage data has dropped (or risen) from that in the normal situation by a given threshold (e.g., 100 mV per cell in this embodiment) or more (S08). In order to detect a sharp voltage drop, it may also be determined whether the measurement value has dropped from the previously measured value by the given threshold or more.

When the voltage has not dropped by the given threshold or more at step S08, the flow returns to step S01 and repeats the measurement process. When the voltage has dropped by the given threshold or more at step S08, it is next determined whether the voltage drop has continued for a given time (S09). In this embodiment, it is determined whether the voltage drop has continued for 3 measurement cycles (300 msec.). When the voltage drop does not continue for 3 measurement cycles, the flow returns to step S01 and repeats the measurement process. Meanwhile, when the voltage drop has continued for 3 measurement cycles, the mode is shifted to the data lock mode in which the measurement data is locked (S10). At this time, for example, voltage data (which may include temperature data) recorded in the internal memory 37 within past 1 second is locked by setting a flag indicating that overwriting or deletion of the data is forbidden. Subsequently, the flow returns to step S01 and repeats the measurement process.

Meanwhile, when the current mode at step S06 is the data lock mode, the measurement data of temperature and voltage is recorded together with a time stamp in the internal memory 37 after setting the flag indicating that the measurement data is locked (S11). Although the internal memory 37 preferably has a capacity sufficient to save the locked data (measurement data in a time range of about 10 minutes in this embodiment), for example when the capacity of the internal memory 37 is insufficient and the internal memory 37 is saturated with locked data and has no extra area to record new data therein, an error message or warning may be sent to the prime monitoring device 10 through the station device 20.

Thereafter, it is determined whether a given time (10 minutes in this embodiment) has passed from a point of time when a continuous voltage drop (detection of discharging of the storage battery 41) has been detected for consecutive 3 cycles at step S09 (S12). When 10 minutes has not passed, the flow returns to step S01 and repeats the measurement process. Meanwhile, when 10 minutes has passed, the data lock mode is shifted to the normal mode (S13) and the flow returns to step S01 to repeat the measurement process. More specifically, measurement data in the subsequent cycles is recorded in the internal memory 37 as unlocked data by the process at steps following step S07. Even when the data lock mode is shifted to the normal mode, measurement data recorded as locked data in the past is saved in its locked state until it is transmitted to the prime monitoring device 10 through the station device 20 as described later.

As shown in FIG. 4, in this embodiment, the measurement data to be locked is locked by setting a flag thereto, but the data locking method is not limited to this. For example, when a continuous voltage drop for consecutive 3 cycles (discharging of the storage battery 41) is detected at step S09, by calculating a time stamp at 1 second before the point of time of the detection and a time stamp at 10 minutes after the same and saving the respective time stamps as information of a lock start time and a lock ending time, whether the measurement data is to be locked may be determined depending on whether the measurement data is included within the time range. Alternatively, a memory area for locked data and a memory area for unlocked data may be separated from each other in the internal memory 37 (in this case, the process in which unlocked data recorded within past 1 second is moved to the memory area for the locked data is carried out).

Furthermore, in the process flow shown in FIG. 4, the process based on an instruction from the prime monitoring device 10 at steps S01 to S02 and the parameter measurement process by the end device 30 at step S03 and subsequent steps are described as sequential processes for the sake of convenience, but the processing order is not limited to this. Also, the process may be executed as an event-driven process with using the reception of an instruction from the prime monitoring device 10, the passage of the measurement cycle of 100 msec. or the like as a trigger.

Figure 6:
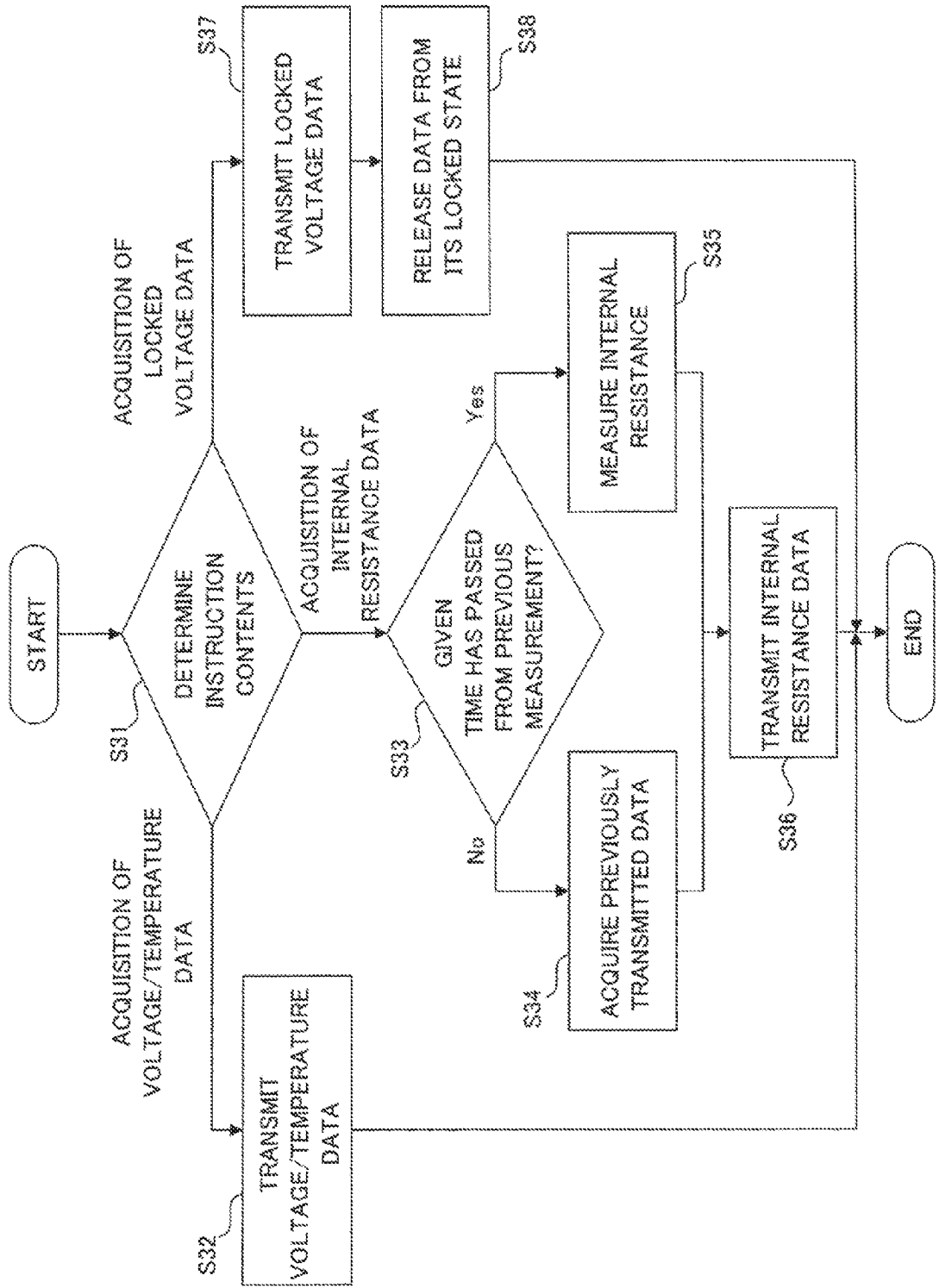
FIG. 6 is a flowchart schematically showing an example of a flow of an instruction execution process according to the one embodiment of the present invention.

FIG. 6 is a flowchart schematically showing an example of a flow of the instruction execution process at step S02 in the measurement process by the end device 30 shown in FIG. 4. When having received an instruction from the prime monitoring device 10, the measurement control unit 31 first determines the contents of the instruction (S31), and executes a process in accordance with the contents.

When the contents of the instruction received at step S31 are a request for acquiring the measurement data of the voltage and temperature, the measurement data of the voltage and temperature recorded and accumulated in the internal memory 37 after the previous transmission of measurement data to the prime monitoring device 10 (the latest data measured at every 100 msec. by the process at step S04 and subsequent steps of FIG. 4) is transmitted to the prime monitoring device 10 through the station device 20 (S32) to end the process. In this embodiment, the prime monitoring device 10 is designed to automatically and regularly transmit the request for acquiring the measurement data by the monitor controlling unit 12 at a given interval (e.g., every 5 minutes) set in the setting information 15 or the like. The transmitted measurement data may be deleted from the internal memory 37. When the transmitted measurement data is not deleted from the internal memory 37, for example, a time stamp for the latest one of the transmitted measurement data is saved so that the transmitted measurement data can be distinguished from untransmitted measurement data.

When the contents of the instruction received at step S31 are a request for acquiring measurement data of the internal resistance of the storage battery 41, it is determined whether a given time (e.g., 1 hour in this embodiment) has passed from the previous measurement of the internal resistance (S33). In this embodiment, the prime monitoring device 10 is designed to automatically and regularly transmit a request for acquiring the measurement data by the monitor controlling unit 12 at a given cycle (e.g., once a day) set in the setting information 15 or the like. In addition, the request for acquiring the measurement data may be transmitted based on an instruction input manually by the user.

When 1 hour or more has not passed from the previous measurement at step S33, in order to avoid the case where an unnecessary load is applied to the storage battery 41 due to the measurement process of internal resistance carried out consecutively in a short time (e.g., the user repeats input of instructions to the prime monitoring device 10 consecutively in a short time), the measurement of internal resistance is not carried out. At this time, in this embodiment, the measurement data of the internal resistance obtained at the previous measurement is read out of the internal memory 37 (S34) and is transmitted as measurement data (S36).

Meanwhile, when 1 hour or more has passed from the previous measurement at step S33, the internal resistance of the storage battery 41 is measured by the internal resistance measuring unit 34 (S35), and the flow proceeds to step S36. Here, as described above, sine waves of a plurality of frequencies are generated by the sine wave generating unit 35 and the current (e.g., 3 A or less) at each frequency is applied to the storage battery 41, and the internal resistance at each frequency is calculated based on the measurement data of the current value and the voltage value between the terminals. In this embodiment, as described above, the plurality of frequencies include at least the high frequency of about 1 kHz and the low frequency of lower than 100 Hz and may further include an additional different frequency. The obtained data of internal resistance is recorded in the internal memory 37.

Thereafter, the measurement data of the internal resistance is transmitted to the prime monitoring device 10 through the station device 20 (S36) to end the process. Depending on a time required for measuring the internal resistance at step S35, for example, in response to the instruction of measuring internal resistance received once a day, the measurement process of internal resistance at step S35 is executed, and the data of previous measurement result recorded in the internal memory 37 may also be transmitted (one day later) to the prime monitoring device 10 at step S36 asynchronously with the measurement of internal resistance at step S35.

When the contents of the instruction at step S31 are a request for acquiring the locked voltage data (which may include temperature data) measured during the discharging or charging of the storage battery 41, the locked measurement data of voltage (and temperature) is acquired from the internal memory 37 and transmitted to the prime monitoring device 10 through the station device 20 (S37).

In this embodiment, the prime monitoring device 10 transmits a request for acquiring locked voltage data based on an instruction input manually by the user. For example, the user can know that the operation of the power supply device 40 (discharging of the storage battery 41) is started based on the information obtained from the power supply control device 50 through the prime monitoring device 10, and then the user instructs to acquire the locked voltage data after waiting for the recovery from a failure of the like. Since the prime monitoring device 10 can acquire a DC current value during the discharging of the storage battery 41 from the power supply control device 50, the degradation determining unit 13 can calculate a DC resistance value based on these data.

Thereafter, transmitted data is released from its locked state (S38) to end the process. The data released from its locked state becomes ordinary data that can be overwritten. The data may be deleted from the internal memory 37 instead of being released from its locked state.

Instructions from the prime monitoring device 10 include an instruction to set various types of setting information (e.g., information of the measurement interval of temperature and voltage measured at a fixed interval and information of the time range during which measurement data of voltage is locked when discharging of the storage battery 41 is detected based on a voltage drop) in addition to the above-mentioned request to measure the parameters and request to acquire the measurement data. The setting contents specified by the instruction are recorded in, for example, the internal memory 37 and are referred to by the measurement control unit 31.

Also, the instructions may include an instruction on an operation mode such as the power-saving mode in which circuits of each unit and others remain sleeping except a time to be actuated and an instruction to stop the end device 30. For example, when receiving a stop instruction, the measurement process is ended and the operation of the device is stopped, or the mode thereof may be shifted to the sleep mode, stand-by mode or others instead of stopping. The end device 30 may be designed to be returned from the sleep mode or stand-by mode upon reception of a return instruction from the prime monitoring device 10 serving as a trigger.

As described above, in the battery-state monitoring system 1 of one embodiment of the present invention, parameters of a plurality of storage batteries 41 constantly connected to an equipment such as voltage, internal resistance, and DC resistance at the discharging or charging in addition to temperature are automatically measured or acquired, and the internal resistance is measured by using a plurality of frequencies, so that the state and service life of each storage battery 41 can be estimated at high precision.

Also, the battery-state monitoring system 1 has the hierarchical configuration composed of the prime monitoring device 10, the station devices 20 and the end devices 30, and the station devices 20 and the end devices 30 are connected by a radio communication, so that various parameters of a number of the storage batteries 41 can be measured efficiently.

In this configuration, each end device 30 measures various parameters in accordance with the setting contents and others specified by the prime monitoring device 10 and transmits the measured parameters to the prime monitoring device 10 through the station device 20, and also automatically detects the discharging and charging of the storage battery 41 and saves the measurement data of voltage obtained during the discharging and charging in the locked state so that the measurement data is not lost by overwriting or the like. As a result, a voltage change caused by a DC current can be monitored in each of the end devices 30, and the state and service life of each storage battery 41 can be estimated more accurately at higher precision.

In the foregoing, the invention made by the inventors of the present invention has been concretely described based on the embodiments. However, it is needless to say that the present invention is not limited to the foregoing embodiments and various modifications and alterations can be made within the scope of the present invention.

INDUSTRIAL APPLICABILITY

The present invention can be applied to a battery-state monitoring system in which a state of a storage battery constantly connected to an equipment for use in backup power, output variation and others is monitored and estimated by applying electric power thereto.

DESCRIPTION OF REFERENCE SIGNS

1 Battery-state monitoring system
10 Prime monitoring device
11 Interface unit
12 Monitor controlling unit
13 Degradation determining unit
14 Measurement history
15 Setting information
20 Data relay device (station device)
30 State measuring device (end device)
31 Measurement control unit
32 Temperature measuring unit
33 Voltage measuring unit
34 Internal resistance measuring unit
35 Sine wave generating unit
36 Communication unit
37 Internal memory
38 External memory
39 Temperature sensor
40 Power supply device
41 Storage battery
50 Power supply control device
60 Network

The invention claimed is:

1. A battery-state monitoring system which monitors a state of each of a plurality of storage batteries connected in series and constituting an assembled battery incorporated in an equipment, the system comprising:
   a current detecting device which detects a current in each of the storage batteries; and
   a state measuring device which measures a temperature, a voltage, and internal resistance of each of the storage batteries, the internal resistance being measured by using at least two or more kinds of frequencies including at least a first frequency of lower than 200 Hz and a second frequency of 200 Hz or higher to lower than 2000 Hz,
   wherein degradation of each of the storage batteries is estimated based on at least one or more values of the temperature, the voltage, and the internal resistance measured by the state measuring device and a DC resistance of each of the storage batteries obtained from a ratio between a change in a current value detected by the current detecting device and a change in a voltage value measured by the state measuring device during discharging of each of the storage batteries;

wherein the state measuring device measures and records a temperature and a voltage regularly at a given time interval, and when a state where a voltage drop from a normal voltage value by a given threshold or more has continued for a given time is detected, the state measuring device protects measurement data of the voltage obtained in a given time range before and after a point of time of the detection so as not to be lost.

2. The battery-state monitoring system according to claim 1, wherein the state measuring device measures the internal resistance of the storage battery by using three kinds of frequencies including the first frequency set to be lower than 100 Hz, the second frequency set to be 350 Hz or higher to lower than 2000 Hz, and a third frequency of 100 Hz or higher to lower than 350 Hz.

3. The battery-state monitoring system according to claim 1, wherein, when a temperature value and/or a voltage value of the storage battery measured by the state measuring device exceed a given value or decrease below a given value, it is determined that the storage battery has a problem, and degradation of the storage battery is estimated based on internal resistance of the storage battery measured by the state measuring device and/or a change rate of a DC resistance value from an initial value during discharging of the storage battery.

4. A battery-state monitoring system which monitors a state of each of a plurality of storage batteries connected in series and constituting an assembled battery incorporated in an equipment, the system comprising:

a current detecting device which detects a current in each of the storage batteries;

a state measuring device which measures a temperature, a voltage, and internal resistance of each of the storage batteries, the internal resistance being measured by using at least two or more kinds of frequencies including at least a first frequency of lower than 200 Hz and a second frequency of 200 Hz or higher to lower than 2000 Hz;

wherein degradation of each of the storage batteries is estimated based on at least one or more values of the temperature, the voltage, and the internal resistance measured by the state measuring device and a DC resistance of each of the storage batteries obtained from a ratio between a change in a current value detected by the current detecting device and a change in a voltage value measured by the state measuring device during discharging of each of the storage batteries;

an end device composed of the state measuring device;

a prime monitoring device which acquires data detected or measured by the current detecting device and/or the state measuring device and estimates degradation of each of the storage batteries based on the acquired data; and a station device which relays a communication between the prime monitoring device and the end device, wherein one or more station devices are connected to the prime monitoring device so as to enable communication therebetween, and one or more end devices are connected to each of the station devices so as to enable communication therebetween.

5. The battery-state monitoring system according to claim 4, wherein the communication between the station device and the end device is radio communication.

6. The battery-state monitoring system according to claim 4, wherein the end device measures internal resistance of the storage battery based on an instruction from the prime monitoring device sent through the station device.

7. The battery-state monitoring system according to claim 6, wherein the end device does not carry out measurement of internal resistance when an instruction to measure internal resistance of the storage battery from the prime monitoring device is received before a given time or more has passed from previous measurement.

8. The battery-state monitoring system according to claim 4, wherein the end device transmits data obtained by measurement to the prime monitoring device through the station device based on an instruction from the prime monitoring device sent through the station device.

9. The battery-state monitoring system according to claim 4, wherein the prime monitoring device divides the end devices into a plurality of groups, and sends an instruction to measure internal resistance to the end devices belonging to each group at different timings separately set for respective groups so that timing to measure the internal resistance of each storage battery by the end devices belonging to each group does not overlap with that by the end devices belonging to a different group.

10. The battery-state monitoring system according to claim 4, wherein the end device is fixedly installed to the storage battery.

11. The battery-state monitoring system according to claim 4, wherein the end device can put circuits other than those needed for processing into a sleep state.

* * * * *